United States Patent [19]

Sato et al.

[11] 4,369,478

[45] Jan. 18, 1983

[54] AUTOMOBILE MAGNETIC TAPE PLAYING APPARATUS

[75] Inventors: Masaaki Sato; Akira Osanai, both of Hachioji; Hajime Iwase, Fujimi, all of Japan

[73] Assignee: Olympus Optical Co., Ltd., Tokyo, Japan

[21] Appl. No.: 46,960

[22] Filed: Jun. 8, 1979

[30] Foreign Application Priority Data

Jun. 15, 1978 [JP] Japan .................................. 53-72604

[51] Int. Cl.³ .......................... G11B 15/00; H04B 1/20
[52] U.S. Cl. ...................................... 360/137; 369/11
[58] Field of Search ................... 360/137; 179/100.11; 369/10, 11

[56] References Cited

U.S. PATENT DOCUMENTS

| | | | |
|---|---|---|---|
| 3,632,894 | 1/1972 | Bretschneider | 179/100.11 |
| 3,644,684 | 2/1972 | Tsuji | 179/100.11 |
| 3,645,540 | 2/1972 | Tanaka | 360/137 |
| 3,978,524 | 8/1976 | Gordon | 360/137 |
| 4,064,374 | 12/1977 | Sato | 360/137 |

*Primary Examiner*—Aristotelis M. Psitos

[57] ABSTRACT

An automobile magnetic tape playing apparatus includes a magnetic tape driving unit with a magnetic head and an amplifier unit carried on an automobile. These units are mechanically and electrically connected and disconnected to each other so that the magnetic tape driving unit may be carried out from an automobile by separating it from the amplifier unit, if necessary.

6 Claims, 5 Drawing Figures

4,369,478

AUTOMOBILE MAGNETIC TAPE PLAYING APPARATUS

BACKGROUND OF THE INVENTION

This invention relates to a magnetic tape playing apparatus which is provided with a reproduction capacity and adapted to be carried in an automobile.

With a magnetic tape playing apparatus used with an automobile stereophonic system, its housing generally contains a magnetic tape-driving mechanism, reproduction magnetic head and amplifier unit all assembled together. Accordingly, application of an expensive magnetic tape-driving mechanism and reproduction magnetic head is restricted to an automobile stereophonic system. The amplifier unit is unavailable for other applications, though occupying a certain space in the narrow area of an automobile. From the economic stand point, therefore, the above-mentioned circumstances have been considered extremely disadvantageous. When an automobile stereophonic system failed, repair involved troublesome work, because it was necessary to take off wiring from a power source and loud speakers and then remove the whole housing from an automobile, even though the failure was limited to the tape-driving mechanism or magnetic head.

SUMMARY OF THE INVENTION

It is accordingly the object of this invention to provide an automobile magnetic tape playing apparatus offering great economic advantages and allowing for easy maintenance and repair.

An automobile stereophonic system embodying this invention is characterized in that a reproduction magnetic head and magnetic tape-driving mechanism are assembled into a single unit; an amplifier is provided as a separate unit in an automobile; and the magnetic tape-driving mechanism is detachably connected to the amplifier, mechanically as well as electrically. The magnetic tape-driving unit which can be easily taken out of an automobile as the need arises is also applicable as a magnetic tape-driving unit for a household stereophonic system. If the expensive magnetic tape-driving unit is kept in the user's house during night time parking of the automobile, it is possible to reduce damages which might arise if the automobile is burglarized. Repair and maintenance of the magnetic tape-driving unit can be easily effected, simply by removing it from the amplifier. Further, the amplifier unit can be designed concurrently to function as a tuner or transceiver. If fitted with a power supply inlet, the amplifier unit is also applicable to, for example, electric appliances, such as a coffee pot or electric razor. If an amplifier unit used with a household system has a recording function, the magnetic head of the automobile magnetic tape-driving unit can carry out both recording and reproduction. In this case, the same magnetic tape-driving speed and azimuth conditions are realized during recording as well as during reproduction, thus offering excellent tone effects.

DESCRIPTION OF THE PREFERRED EMBODIMENT

There will now be described by reference to the appended drawings the arrangement and operation of a magnetic tape playing apparatus used with an automobile stereophonic system embodying this invention.

Figure 1:
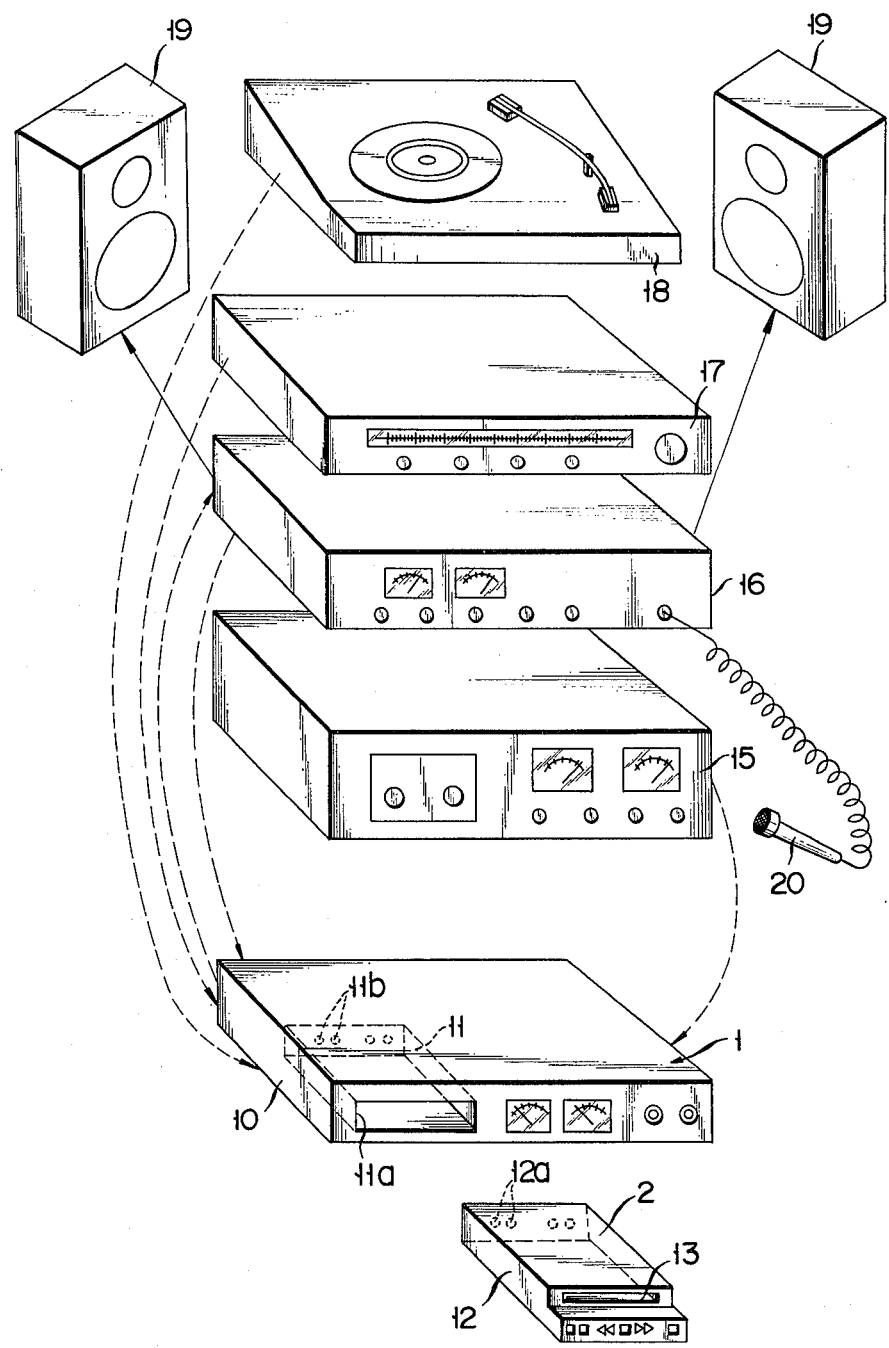
FIG. 1 is an oblique view of a magnetic tape-driving unit used with an automobile stereophonic system embodying this invention and an amplifier unit used with a household stereophonic system.

Referring to FIG. 1, reference numeral 1 denotes an amplifier unit and reference numeral 2 shows a magnetic tape-driving unit. The amplifier unit 1 is formed of known amplifier set in a housing 10. The housing 10 has a chamber 11 for receiving the magnetic tape-driving unit 2. The chamber 11 has a magnetic tape-driving unit inlet 11a formed at the front of the housing 10. The chamber 11 has slightly larger dimensions than the housing 12 of the magnetic tape-driving unit 2 in order to securely receive said magnetic tape-driving unit 2. This magnetic tape-driving unit 2 has a cassette tape-receiving chamber 13, which contains a mechanism for driving a magnetic cassette tape and a reproduction magnetic head for reproduction of data recorded on the magnetic tape. Provided between the magnetic tape driving unit-receiving chamber 11 of the amplifier unit housing 10 and the housing 12 of the magnetic tape-driving unit 2 are a mechanical coupling means for preventing the magnetic tape-driving unit 2 from falling off the magnetic tape driving unit-receiving chamber 11 and an electric coupling means for effecting electric connection between the amplifier unit 1 and magnetic tape-driving unit 2 when the above-mentioned mechanical coupling is carried out. The mechanical coupling can be ensured by various processes, for example, snapping, engagement or abutment under pressure. In any case, it is preferred that the magnetic tape-driving unit 2 be manually fitted to or removed from the amplifier unit 1 without the use of tools. The mechanical coupling of the amplifier unit 1 with the magnetic tape-driving unit 2 is effected by frictional engagement between both lateral walls and/or between upper and lower walls of the magnetic tape driving unit-receiving chamber 11. The electric coupling of the amplifier unit 1 with the magnetic tape-driving unit 2 may be undertaken by a combination of a connection plug and jack or by abutment under pressure. With this embodiment, the above-mentioned electric coupling is carried out by the steps of setting plugs 11b electrically connected to the amplifier unit 1 and protruding from the backside of the magnetic tape unit-receiving chamber 11 into the interior thereof and drilling socket holes 12a in the surface of the backside of the magnetic tape-driving unit 2 for electric connection to the plugs 11b.

FIG. 1 indicates a known household recording-reproduction apparatus which is formed of a combination of, for example, a deck 15, amplifier 16, tuner 17, record player 18, speakers 19 and recording microphone 20. With an automobile stereophonic system, the deck 15 and amplifier 16 are replaced by a combination of the aforesaid amplifier unit 1 and magnetic tape-driving unit 2.

Figure 2:
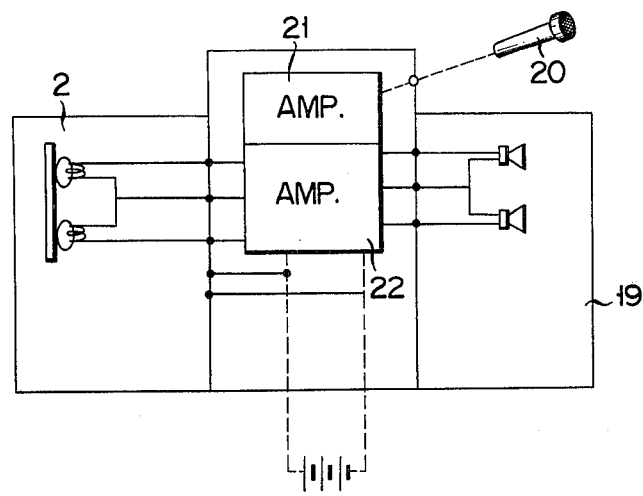
FIG. 2 is a schematic block circuit diagram of an amplifier unit used with a household stereophonic system.
Figure 3:
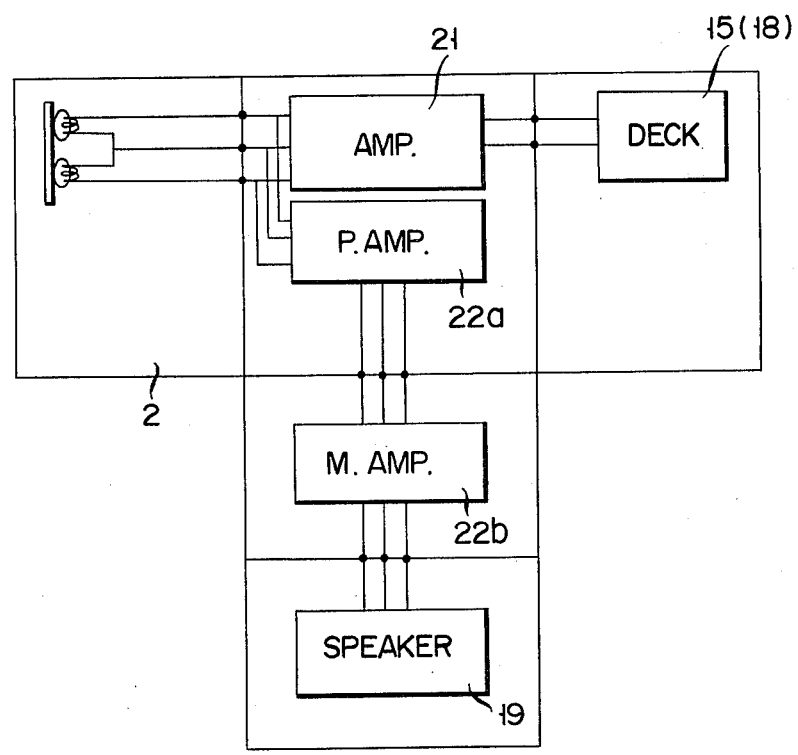
FIG. 3 is a modification of the block circuit diagram of FIG. 2.

As seen from FIG. 2, the amplifier 16 is formed of a recording amplifier element 21 connected to the microphone 20, and a reproduction amplifier element 22. The reproduction amplifier element 22 may consist of a preamplifier element 22a and main amplifier element 22b as shown in FIG. 3.

Figure 4:
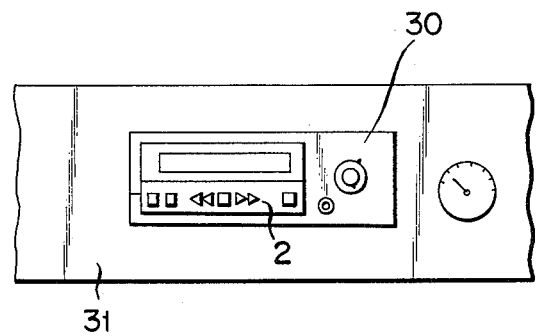
FIG. 4 is a front view of the tape-driving unit fitted to an amplifier unit mounted on an automobile dashboard.
Figure 5:
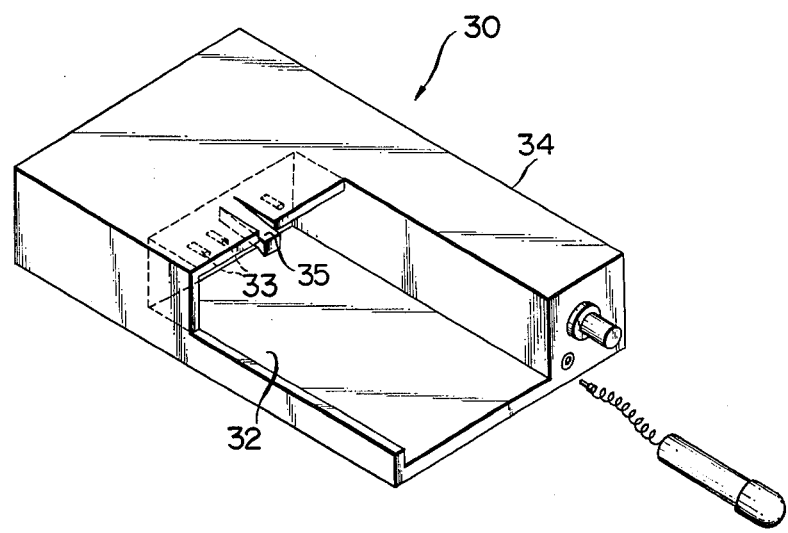
FIG. 5 is an perspective view of an amplifier unit used with an automobile stereophonic system.

An amplifier unit 30 having the same arrangement as the aforesaid amplifier unit 1 is fitted to an automobile dashboard 31 as shown in FIG. 4 by means of, for example, screws or an adhesive tape. Loud-speakers (not shown) are connected to the automobile amplifier unit 30, too. When the amplifier unit 30 is loaded with the magnetic tape-driving unit 2, then the assembly functions as an automobile stereophonic system. As seen from FIG. 5, the amplifier unit 30 has a magnetic tape driving unit-receiving chamber 32 formed in the front portion. The magnetic tape-driving unit 2 is electrically connected to the amplifier unit 30 by means of plugs 33 protruding from the backside of said receiving chamber 32 into the interior thereof. The amplifier unit 30 has a housing 34 prepared from a synthetic resin. A downward extending flap 35 is cut out in substantially the central portion of the upper wall of the housing 34. The tip of the flap is made thicker than the other portions of the upper wall of the housing 34 to constitute an engagement member. When the magnetic tape-driving unit 2 is inserted into the magnetic driving unit-receiving chamber 32, the elastic force of the flap 35 pushes the magnetic tape-driving unit 2 downward. At this time, the thick-walled engagement member of the flap 35 is fitted into a recess (not shown) formed in the surface of the upper wall of the housing 12 of the magnetic tape-driving unit 2, thereby ensuring a mechanical engagement between the magnetic tape-driving unit 2 and amplifier unit 1.

Where the above-mentioned automobile magnetic tape playing/recording apparatus enbodying this invention is applied to a stereophonic system to be carried in a car, it is advised to connect the magnetic tape-driving unit 2 to the amplifier unit 30 fixed to an automobile dashboard and insert a cassette tape into the magnetic tape-driving unit 2. If the magnetic tape-driving unit 2 is taken off the amplifier unit 30 while an automobile is parked, for example, during night time, and kept in the household, then the magnetic tape-driving unit 2 is saved from theft. Further, if the magnetic tape-driving unit 2 combined with the amplifier unit 1 is used in the household in place of the deck 15 of a recording-reproduction device or record player 18, then it is possible to record data in the magnetic tape-driving unit 2 or enjoy music reproduced therefrom. Since it is possible to reproduce in an automobile, for example, music pieces or songs sung by family members which are recorded in the magnetic tape-driving unit 2 particularly in the household, then the magnetic tape-driving unit 2 affords the listener greater enjoyment.

What we claim is:

1. An automobile magnetic tape playing apparatus comprising an amplifier unit mounted in an automobile;
   a magnetic tape-driving unit including a magnetic head for reproducing data from a magnetic tape and a magnetic tape-driving mechanism allowing for the run of the magnetic tape;
   mechanical support means for detachably fitting the magnetic tape-driving unit to the amplifier unit by; and
   an electric coupling means for electrically connecting the magnetic tape-driving unit to the amplifier unit, with both elements electrically shut off as need arises.

2. The automobile magnetic tape playing apparatus according to claim 1, wherein the amplifier unit has a housing provided with a chamber into which the magnetic tape-driving unit is detachably inserted.

3. The automobile magnetic tape playing apparatus according to claim 2, wherein the magnetic tape driving unit-supporting means has a support member for elastically holding said magnetic tape-driving unit.

4. The automobile magnetic tape playing apparatus according to claim 3, wherein the housing of the amplifier unit comprises an upper wall prepared from a synthetic resin and a flap cut out in part of the upper wall to constitute a support member for the magnetic tape-driving unit.

5. The automobile magnetic tape playing apparatus according to claim 2, wherein the electric coupling means comprises plugs provided in the amplifier unit to protrude into the magnetic tape driving unit-receiving chamber and sockets for receiving the plugs when the magnetic tape-driving unit is inserted into the amplifier unit, thereby establishing electric connection between the magnetic tape-driving unit and amplifier unit.

6. The automobile magnetic tape playing apparatus according to any of the preceding claims, which further comprises another amplifier unit to which the magnetic tape-driving unit is connected electrically and mechanically.

* * * * *